(12) United States Patent
Saijo et al.

(10) Patent No.: US 12,205,801 B2
(45) Date of Patent: Jan. 21, 2025

(54) PLASMA PROCESSING APPARATUS AND PLASMA PROCESSING METHOD

(71) Applicant: Tokyo Electron Limited, Tokyo (JP)

(72) Inventors: Toshiaki Saijo, Miyagi (JP); Jun Abe, Miyagi (JP); Shogo Shoji, Miyagi (JP); Junya Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 353 days.

(21) Appl. No.: 17/468,935

(22) Filed: Sep. 8, 2021

(65) Prior Publication Data
US 2022/0076930 A1    Mar. 10, 2022

(30) Foreign Application Priority Data
Sep. 9, 2020 (JP) .................................. 2020-151116

(51) Int. Cl.
*H01J 37/32* (2006.01)
(52) U.S. Cl.
CPC .. *H01J 37/32642* (2013.01); *H01J 37/32146* (2013.01); *H01J 37/32715* (2013.01); *H01J 2237/2007* (2013.01); *H01J 2237/24564* (2013.01)
(58) Field of Classification Search
CPC ........... H01J 37/32715; H01J 37/32165; H01J 37/32706; H01J 37/32935; H01J 37/32642; H01J 37/32146; H01J 2237/2007; H01J 2237/24564
See application file for complete search history.

(56) References Cited

U.S. PATENT DOCUMENTS

2018/0366305 A1\* 12/2018 Nagami ............ H01J 37/32165
2019/0237305 A1\* 8/2019 Tsujimoto ........... H01L 21/6831

FOREIGN PATENT DOCUMENTS

JP    2019-004027 A    1/2019

\* cited by examiner

*Primary Examiner* — Yuechuan Yu
(74) *Attorney, Agent, or Firm* — Pearne & Gordon LLP

(57) ABSTRACT

In a plasma processing apparatus, a controller specifies a time point when a current starts to flow between an edge ring and a DC power supply after beginning an application of a negative DC voltage to the edge ring from the DC power supply. The controller specifies, from a voltage measurement value indicating a voltage of the edge ring at the time point, an estimate of a self-bias voltage of the edge ring generated by a supply of a radio frequency power. The controller sets a sum of an absolute value of the estimate of the self-bias voltage and a set value as an absolute value of the negative DC voltage to be applied to the edge ring by the DC power supply.

7 Claims, 4 Drawing Sheets

PLASMA PROCESSING APPARATUS AND PLASMA PROCESSING METHOD

CROSS-REFERENCE TO RELATED APPLICATION

This application claims the benefit of Japanese Patent Application No. 2020-151116 filed on Sep. 9, 2020, the entire disclosure of which is incorporated herein by reference.

TECHNICAL FIELD

The various aspects and embodiments described herein pertain generally to a plasma processing apparatus and a plasma processing method.

BACKGROUND

A plasma processing apparatus is used in a plasma processing upon a substrate. The plasma processing apparatus is equipped with a chamber and a substrate support. The substrate support is provided within the chamber, and has a lower electrode and an electrostatic chuck. The substrate support supports an edge ring disposed thereon. The substrate is placed on a region on the substrate support surrounded by the edge ring. When a plasma processing is performed, a radio frequency power is supplied from a radio frequency power supply.

As the plasma processing is performed, the thickness of the edge ring decreases. If the thickness of the edge ring is reduced, an upper end position of a sheath (plasma sheath) above the edge ring becomes lower than an upper end position of the sheath above the substrate. As a result, an incident direction of ions upon an edge of the substrate is slopped.

Patent Document 1 describes a technique of correcting the incident direction of the ions vertically. In the technique described in Patent Document 1, a pulse of a radio frequency power is periodically supplied, and a pulse of a negative DC voltage synchronized with the pulse of the radio frequency power is periodically applied to the edge ring. The negative DC voltage has, as an absolute value thereof, the sum of an absolute value of a self-bias voltage of the edge ring and a set value. The self-bias voltage of the edge ring is specified by measuring a voltage of the edge ring in a period during which the supply of the pulse of the negative DC voltage is stopped.

Patent Document 1: Japanese Patent Laid-open Publication No. 2019-004027

SUMMARY

In one exemplary embodiment, a plasma processing apparatus is provided. The plasma processing apparatus includes a chamber, a substrate support, a radio frequency power supply, a DC power supply, a voltmeter, an ammeter and a controller. The substrate support is provided within the chamber, and includes an electrode and an electrostatic chuck provided on the electrode. The radio frequency power supply is configured to supply a radio frequency power to the electrode of the substrate support. The DC power supply is electrically coupled to an edge ring disposed on the substrate support to surround a substrate, and is configured to generate a negative DC voltage to be applied to the edge ring. The voltmeter is configured to acquire a voltage measurement value indicating a voltage of the edge ring. The ammeter is configured to acquire a current measurement value indicating a current flowing between the edge ring and the DC power supply. The controller specifies, from the current measurement value acquired by the ammeter, a time point when the current starts to flow between the edge ring and the DC power supply after beginning an application of the negative DC voltage to the edge ring from the DC power supply. The controller specifies, from the voltage measurement value at the time point acquired by the voltmeter, an estimate of a self-bias voltage of the edge ring generated by a supply of the radio frequency power. The controller sets a sum of an absolute value of the estimate of the self-bias voltage and a set value as an absolute value of the negative DC voltage to be applied to the edge ring by the DC power supply.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
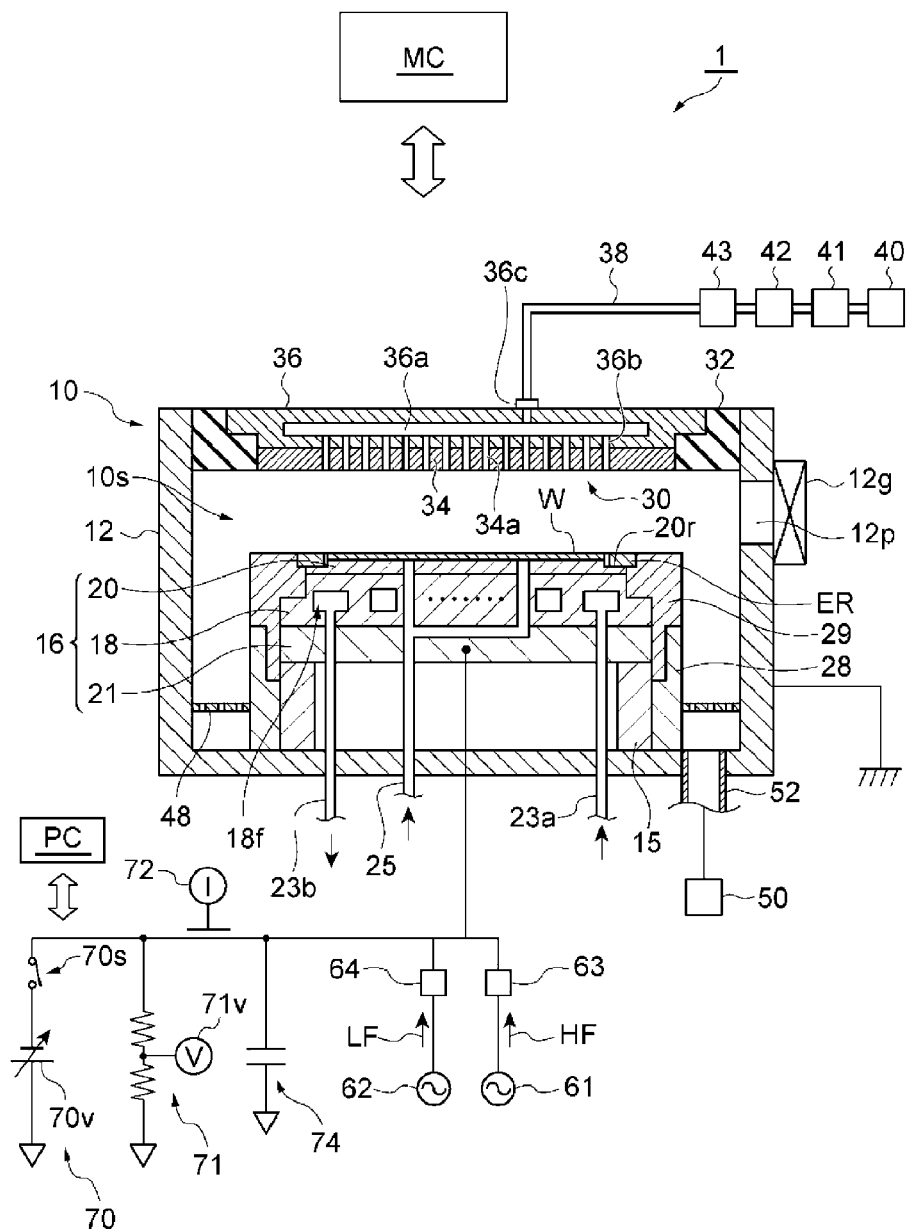
FIG. 1 is a diagram schematically illustrating a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, various exemplary embodiments will be described.

In one exemplary embodiment, a plasma processing apparatus is provided. The plasma processing apparatus includes a chamber, a substrate support, a radio frequency power supply, a DC power supply, a voltmeter, an ammeter and a controller. The substrate support is provided within the chamber, and includes an electrode and an electrostatic chuck provided on the electrode. The radio frequency power supply is configured to supply a radio frequency power to the electrode of the substrate support. The DC power supply is electrically coupled to an edge ring disposed on the substrate support to surround a substrate, and is configured to generate a negative DC voltage to be applied to the edge ring. The voltmeter is configured to acquire a voltage measurement value indicating a voltage of the edge ring. The ammeter is configured to acquire a current measurement value indicating a current flowing between the edge ring and the DC power supply. The controller specifies, from the current measurement value acquired by the ammeter, a time point when the current starts to flow between the edge ring and the DC power supply after beginning an application of the negative DC voltage to the edge ring from the DC power supply. The controller specifies, from the voltage measurement value at the time point acquired by the voltmeter, an estimate of a self-bias voltage of the edge ring generated by a supply of the radio frequency power. The controller sets a sum of an absolute value of the estimate of the self-bias voltage and a set value as an absolute value of the negative DC voltage to be applied to the edge ring by the DC power supply.

After beginning the application of the negative DC voltage to the edge ring, the current starts to flow between the edge ring and the DC power supply at the time point when the voltage of the edge ring exceeds the self-bias voltage. Thus, according to the exemplary embodiment, it becomes possible to obtain the estimate of the self-bias voltage of the edge ring from the voltage measurement value measured in the state that the negative DC voltage is applied to the edge ring, and adjust the negative DC voltage to be applied to the edge ring based on the estimate. Further, since the estimate of the self-bias voltage of the edge ring can be obtained from the voltage measurement value obtained in the state that the application of the negative DC voltage is not stopped, it is possible to suppress fluctuation of plasma in the acquisition of the voltage measurement value, thus suppressing a reflection wave.

The radio frequency power supply may supply a pulse of the radio frequency power periodically. The DC power supply may apply a pulse of the negative DC voltage to the edge ring periodically in synchronization with the pulse of the radio frequency power The controller may be configured to use, as the estimate of the self-bias voltage, an average value (moving average value) of multiple voltage measurement values. Here, the multiple voltage measurement values are obtained by repeating the acquisition of the voltage measurement value at the time point while periodically applying the pulse of the negative DC voltage to the edge ring.

The ammeter and the voltmeter may be embedded in the DC power supply. Further, the ammeter and the voltmeter may be provided at an outside of the DC power supply.

The controller may be embedded in the DC power supply. Further, the controller may be provided at an outside of the DC power supply.

The controller may specify, as the time point when the current starts to flow between the edge ring and the DC power supply, a time point when the current measurement value exceeds a preset threshold within a preset time after beginning the application of the negative DC voltage to the edge ring from the DC power supply.

In another exemplary embodiment, a plasma processing method is provided. The plasma processing method includes a process (a) of preparing a substrate on a substrate support within a chamber of a plasma processing apparatus. The substrate support includes an electrode and an electrostatic chuck provided on the electrode, and is configured to support the substrate placed within a region surrounded by an edge ring provided on the electrostatic chuck. The plasma processing method further includes a process (b) of supplying a radio frequency power to the electrode from a radio frequency power supply. The plasma processing method further includes a process (c) of applying a negative DC voltage to the edge ring from a DC power supply. The plasma processing method further includes a process (d) of adjusting the negative DC voltage. The process (d) includes specifying, from a current measurement value acquired by an ammeter, a time point when a current starts to flow between the edge ring and the DC power supply after beginning the applying of the negative DC voltage to the edge ring from the DC power supply. The process (d) includes specifying, from a voltage measurement value of the edge ring at the time point acquired by a voltmeter, an estimate of a self-bias voltage of the edge ring generated by the supplying of the radio frequency power. The process (d) includes setting a sum of an absolute value of the estimate of the self-bias voltage and a set value as an absolute value of the negative DC voltage to be applied to the edge ring by the DC power supply.

The radio frequency power supply may supply a pulse of the radio frequency power periodically in the process (b). The DC power supply may apply a pulse of the negative DC voltage periodically in synchronization with the pulse of the radio frequency power in the process (c).

In the process (d), an average value of multiple voltage measurement values may be used as the estimate of the self-bias voltage. Here, the multiple voltage measurement values are obtained by repeating the acquiring of the voltage measurement value at the time point while periodically applying the pulse of the negative DC voltage to the edge ring.

As the time point when the current starts to flow between the edge ring and the DC power supply, a time point when the current measurement value exceeds a preset threshold within a preset time after beginning the applying of the negative DC voltage to the edge ring from the DC power supply may be specified.

Hereinafter, various exemplary embodiments will be described in detail with reference to the accompanying drawings. Further, in the various drawings, same or corresponding parts will be assigned same reference numerals.

FIG. 1 is a diagram schematically illustrating a plasma processing apparatus according to an exemplary embodiment. A plasma processing apparatus 1 shown in FIG. 1 is a capacitively coupled plasma processing apparatus. The plasma processing apparatus 1 is equipped with a chamber 10. The chamber 10 provides an internal space 10s therein.

In one exemplary embodiment, the chamber 10 may include a chamber main body 12. The chamber main body 12 has a substantially cylindrical shape. The internal space 10s is provided in the chamber main body 12. The chamber main body 12 is made of, by way of non-limiting example, aluminum. The chamber main body 12 is electrically grounded. A plasma-resistant film is formed on an inner wall surface of the chamber main body 12, that is, a wall surface forming and confining the internal space 10s. This film may be a film formed by anodic oxidation or a ceramic film such as a yttrium oxide film.

A sidewall of the chamber main body 12 is provided with a passage 12p. A substrate W passes through the passage 12p when it is transferred between the internal space 12s and the outside of the chamber 10. A gate valve 12g is provided along the sidewall of the chamber main body 12 to open/close the passage 12p.

The plasma processing apparatus 1 is further equipped with a substrate support 16. The substrate support 16 is provided within the chamber 10. The substrate support 16 is configured to support the substrate W placed thereon. The substrate support 16 may be supported by a support 15. The support 15 extends upwards from a bottom of the chamber main body 12. The support 15 has a substantially cylindrical shape. The support 15 is made of an insulating material such as quartz.

The substrate support 16 includes a lower electrode 18 and an electrostatic chuck 20. The substrate support 16 may further include an electrode plate 21. The electrode plate 21 is made of a conductive material such as aluminum, and has a substantially disk shape. The lower electrode 18 is provided on the electrode plate 21. The lower electrode 18 is made of a conductive material such as aluminum, and has a substantially disk shape. The lower electrode 18 is electrically coupled to the electrode plate 21.

The lower electrode 18 has a path 18f therein. The path 18f is one for a heat exchange medium. The heat exchange medium is supplied from a supply device (for example, a chiller unit) into the path 18 via a pipeline 23a. This supply device is provided at the outside of the chamber 10. The heat exchange medium may be a liquid coolant or a coolant (for example, Freon) that cools the lower electrode 18 by vaporization thereof. The heat exchange medium flows through the path 18f and is returned to the supply device via a pipeline 23b.

The electrostatic chuck 20 is provided on the lower electrode 18. The substrate W is placed on and held by the electrostatic chuck 20 when it is processed in the internal space 10s. The electrostatic chuck 20 has a main body and an electrode. The main body of the electrostatic chuck 20 is made of a dielectric material, and has a substantially disk shape. The electrode of the electrostatic chuck 20 is a film-shaped electrode and provided within the main body of the electrostatic chuck 20. The electrode of the electrostatic chuck 20 is electrically coupled with a DC power supply. If a voltage is applied to the electrode of the electrostatic chuck 20 from the DC power supply, an electrostatic attraction force is generated between the electrostatic chuck 20 and the substrate W. The substrate W is attracted to the electrostatic chuck 20 by the generated electrostatic attraction force to be held by the electrostatic chuck 20.

The plasma processing apparatus 1 may be further equipped with a gas supply line 25. The gas supply line 25 supplies a heat transfer gas, for example, a He gas, from a gas supply mechanism into a gap between a top surface of the electrostatic chuck 20 and a rear surface (bottom surface) of the substrate W.

The plasma processing apparatus 1 may further include a cylindrical member 28 and an insulating member 29. The cylindrical member 28 extends upwards from the bottom of the chamber main body 12. The cylindrical member 28 extends along an outer surface of the support 15. The cylindrical member 28 is made of a conductive material and has a substantially cylindrical shape. The cylindrical member 28 is electrically grounded. The insulating member 29 is provided on the cylindrical member 28. The insulating member 29 is made of a material having insulation property. The insulating member 29 is made of, for example, ceramic such as quartz. The insulating member 29 has a substantially cylindrical shape. The insulating member 29 extends along an outer surface of the electrode plate 21, an outer surface of the lower electrode 18 and an outer surface of the electrostatic chuck 20.

Figure 2:
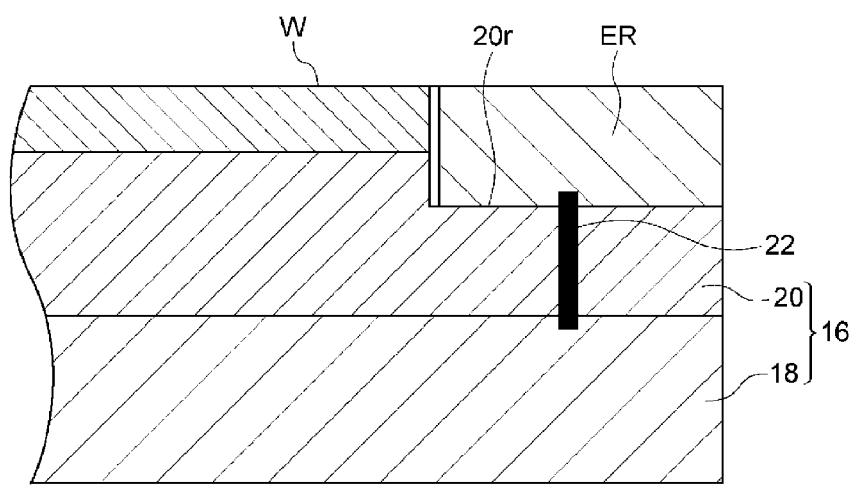
FIG. 2 is a partially enlarged cross sectional view illustrating a substrate support and an edge ring of the plasma processing apparatus according to the exemplary embodiment.

Below, reference is made to FIG. 2 as well as FIG. 1. FIG. 2 is a partially enlarged cross sectional view illustrating the substrate support and an edge ring of the plasma processing apparatus according to one exemplary embodiment. The substrate support 16 is configured to support an edge ring ER placed thereon. In the present exemplary embodiment, the substrate support 16 has a placing region 20r. The placing region 20r may be a peripheral region of the electrostatic chuck 20. The edge ring ER is disposed on the placing region 20r. The edge ring ER has a substantially annular shape, and has conductivity. The edge ring ER may be made of, by way of non-limiting example, silicon or silicon carbide (SiC). The substrate W has a disk shape and is placed within a region on the electrostatic chuck 20 surrounded by the edge ring ER.

As illustrated in FIG. 1, the plasma processing apparatus 1 is further equipped with an upper electrode 30. The upper electrode 30 is provided above the substrate support 16. The upper electrode 30 closes a top opening of the chamber main body 12 along with a member 32. The member 32 has insulation property. The upper electrode 30 is supported at an upper portion of the chamber main body 12 with the member 32 therebetween.

The upper electrode 30 includes a ceiling plate 34 and a supporting body 36. A bottom surface of the ceiling plate 34 forms and confines the internal space 10s. The ceiling plate 34 is provided with a multiple number of gas holes 34a. Each of the gas holes 34a is formed through the ceiling plate 34 in a plate thickness direction thereof (vertical direction). The ceiling plate 34 is made of, by way of example, silicon. Alternatively, the ceiling plate 34 may have a structure in which a plasma-resistant film is formed on a surface of a member which is made of aluminum. This plasma-resistant film may be a film formed by anodic oxidation or a film made of ceramic such as a yttrium oxide film.

The supporting body 36 supports the ceiling plate 34 in a detachable manner. The supporting body 36 is made of a conductive material such as, but not limited to, aluminum. The supporting body 36 has a gas diffusion space 36a therein. The supporting body 36 is further provided with a multiple number of gas holes 36b. The gas holes 36b extend downwards from the gas diffusion space 36a. The gas holes 36b communicate with the gas holes 34a, respectively. The supporting body 36 is further provided with a gas inlet port 36c. The gas inlet port 36c is connected to the gas diffusion space 36a, and a gas supply line 38 is connected to the gas inlet port 36c.

The gas supply line 38 is connected with a gas source group 40 via a valve group 41, a flow rate controller group 42, and a valve group 43. The gas source group 40, the valve group 41, the flow rate controller group 42 and the valve group 43 constitute a gas supply unit. The gas source group 40 includes a plurality of gas sources. Each of the valve group 41 and the valve group 43 includes a plurality of valves (for example, opening/closing valves). The flow rate controller group 42 includes a plurality of flow rate controllers. Each of the flow rate controllers of the flow rate controller group 42 may be a mass flow controller or a pressure control type flow rate controller. Each of the gas sources belonging to the gas source group 40 is connected to the gas supply line 38 via a corresponding valve belonging to the valve group 41, a corresponding flow rate controller belonging to the flow rate controller group 42, and a corresponding valve belonging to the valve group 43. In the plasma processing apparatus 1, gases from one or more gas sources selected from the plurality of gas sources belonging to the gas source group 40 can be supplied into the internal space 10s at individually controlled flow rates.

A baffle plate 48 is provided between the cylindrical member 28 and the sidewall of the chamber main body 12. The baffle plate 48 may be made of, by way of example, an aluminum member coated with ceramic such as yttrium oxide. The baffle plate 48 is provided with a plurality of through holes. Under the baffle plate 48, a gas exhaust line 52 is connected to the bottom of the chamber main body 12. The gas exhaust line 52 is connected to a gas exhaust device 50. The gas exhaust device 50 has a pressure controller such as an automatic pressure control valve and a vacuum pump such as a turbo molecular pump, and is capable of decompressing the internal space 10s.

In the exemplary embodiment, the plasma processing apparatus 1 is further equipped with a radio frequency power supply 61. The radio frequency power supply 61 is a power source configured to generate a radio frequency power HF for plasma formation. The radio frequency power HF has a frequency ranging from 27 MHz to 100 MHz, for example, 40 MHz or 60 MHz. The radio frequency power supply 61 is coupled to the lower electrode 18 via a matching device 63 and the electrode plate 21 to supply the radio frequency power HF to the lower electrode 18. The matching device 63 has a matching circuit for matching an impedance at a load side (lower electrode 18 side) of the radio frequency power supply 61 with an output impedance of the radio frequency power supply 61. Further, the radio frequency power supply 61 may not be electrically coupled to the lower electrode 18, but it may be coupled to the upper electrode 30 via the matching device 63.

The plasma processing apparatus 1 is further equipped with a radio frequency power supply 62. The radio frequency power supply 62 is a power source configured to supply a radio frequency bias power for ion attraction into the substrate W, that is, a radio frequency power LF. The radio frequency power LF has a frequency lower than the frequency of the radio frequency power HF. The frequency of the radio frequency power LF may be in the range from 400 kHz to 13.56 MHz, for example, 400 kHz. The radio frequency power supply 62 is coupled to the lower electrode 18 via a matching device 64 and the electrode plate 21 to supply the radio frequency power LF to the lower electrode 18. The matching device 64 has a matching circuit for matching an impedance at a load side (lower electrode 18 side) of the radio frequency power supply 62 with an output impedance of the radio frequency power supply 62.

Further, in the plasma processing apparatus 1, plasma may be formed by using only the radio frequency power supply 62. In this case, the radio frequency power LF may have a frequency equal to or higher than 13.56 MHz, for example, 40 MHz. In this case, the plasma processing apparatus 1 may not be equipped with the radio frequency power supply 61 and the matching device 63.

In the exemplary embodiment, the radio frequency power supply 61 may supply a continuous wave of the radio frequency power HF, or may supply a pulse of the radio frequency power HF periodically. Further, the radio frequency power 62 may supply a continuous wave of the radio frequency power LF, or may supply a pulse of the radio frequency power LF periodically. When the pulse of the radio frequency power HF and the pulse of the radio frequency power LF are used, the pulses may be synchronized with each other.

In the plasma processing apparatus 1, a gas is supplied into the chamber 10. As the radio frequency power HF and/or the radio frequency power LF is supplied, the gas is excited within the chamber 10. As a result, the plasma is formed within the chamber 10. The substrate W is processed by chemical species such as ions and/or radicals from the formed plasma.

The plasma processing apparatus 1 is further equipped with a DC power supply 70. The DC power supply 70 is electrically coupled to the edge ring ER. In the exemplary embodiment, the DC power supply 70 is coupled to an electrical path which couples the radio frequency power 62 to the lower electrode 18. Further, as shown in FIG. 2, the lower electrode 18 is coupled to the edge ring ER through a conductor 22 therebetween.

The DC power supply 70 is configured to apply a negative DC voltage to the edge ring ER. By applying the negative DC voltage from the DC power supply 70 to the edge ring ER, the thickness of sheath (plasma sheath) above the edge ring ER is adjusted. As a result, an incident direction of the ions upon an edge of the substrate W is adjusted. The negative DC voltage outputted from the DC power supply 70 is set by a controller PC to be described later. Details regarding the setting of the negative DC voltage will be described later.

In the exemplary embodiment, the DC power supply 70 may include a variable DC power supply 70v and a switch 70s. An anode of the variable DC power supply 70v is coupled to the ground, and a cathode of the variable DC power supply 70v is electrically coupled to the edge ring ER with the switch 70s therebetween. In the exemplary embodiment, the DC power supply 70 may apply a pulse of the negative DC voltage to the edge ring ER. The pulse of the negative DC voltage is synchronized with the pulse of the radio frequency power HF and/or the pulse of the radio frequency power LF. In order to apply the pulse of the negative DC voltage to the edge ring ER, an opening/closing operation of the switch 70s is controlled. If the switch 70s is closed, the negative DC voltage is applied to the edge ring ER, whereas if the switch 70s is opened, the application of the negative DC voltage to the edge ring ER is stopped.

The plasma processing apparatus 1 is further equipped with a voltmeter 71 and an ammeter 72. The voltmeter 71 and the ammeter 72 may be embedded in the DC power supply 70. Alternatively, the voltmeter 71 and the ammeter 72 may be separate parts from the DC power supply 70, and may be provided at the outside of the DC power supply 70.

The voltmeter 71 has a voltage sensor 71v and is configured to acquire a voltage measurement value indicating a voltage of the edge ring ER. In the exemplary embodiment, the voltmeter 71 has a voltage divider. The voltage divider is coupled between the edge ring ER and the ground. In the exemplary embodiment, the voltage divider is coupled between the ground and an electrical path that couples the DC power supply 70 to the lower electrode 18. The voltage divider may be a resistor-voltage divider. The voltage sensor 71v is coupled to a node between two resistors of the resistor-voltage divider. The voltage sensor 71v is configured to acquire the voltage measurement value at this node, that is, the voltage measurement value indicating the voltage of the edge ring ER. The voltage measurement value obtained by the voltage sensor 71v is inputted to the controller PC to be used therein.

The plasma processing apparatus 1 is further equipped with the ammeter 72. The ammeter 72 is configured to acquire a current measurement value indicating a current flowing between the edge ring ER and the DC power supply 70. In the exemplary embodiment, the ammeter 72 measures the current flowing through the electrical path that couples the DC power supply 70 and the lower electrode 18 electrically. Further, the ammeter 72 may be a non-contact type current sensor such as a current sensor of a magnetic field detection type, or a current sensor of a resistance detection type. The current measurement value obtained by the ammeter 72 is inputted to the controller PC to be used therein.

The plasma processing apparatus 1 is further equipped with a high-cut filter 74. The high-cut filter 74 is configured to prevent the radio frequency power from being introduced into the DC power supply 70. The high-cut filter 74 has, for example, a capacitor. The capacitor of the high-cut filter 74 is coupled between the ground and the electrical path that couples the DC power supply 70 and the lower electrode 18 electrically.

The plasma processing apparatus 1 is further equipped with the controller PC. The controller PC is configured to control the DC power supply 70. The controller PC may be a computer including a processor, a storage device, an input device, a display device, and so forth. The controller PC may be embedded within the DC power supply 70 or may be provided at the outside of the DC power supply 70.

The plasma processing apparatus 1 is further equipped with a controller MC. The controller MC may be a computer including a processor, a storage device, an input device, a display device, and so forth, and controls the individual components of the plasma processing apparatus 1. To elaborate, the controller MC executes a control program stored in the storage device, and controls the individual components of the plasma processing apparatus 1 based on recipe data stored in the storage device. Under the control of the controller MC, the plasma processing apparatus 1 is capable of performing a process designated by the recipe data. Further, under the control of the controller MC, the plasma processing apparatus 1 is capable of performing a plasma processing method according to various exemplary embodiments. Furthermore, the controller MC is configured to control the overall operation of the plasma processing apparatus 1, and is provided at the outside of the DC power supply 70.

Figure 3:
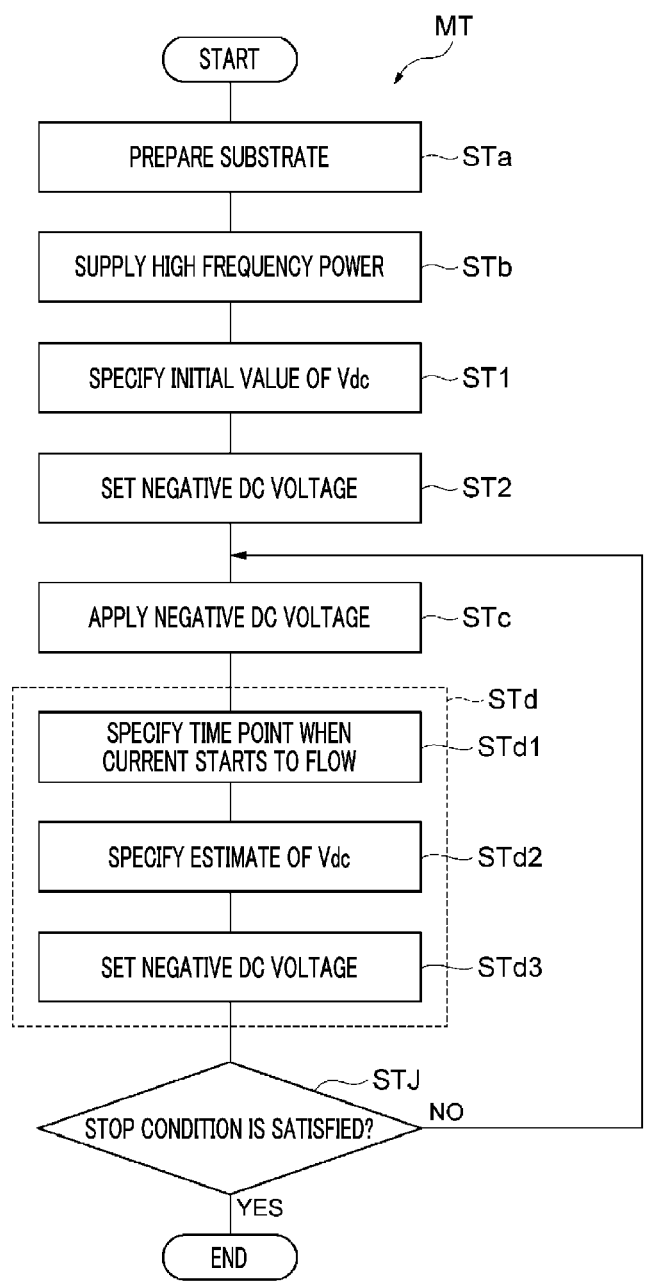
FIG. 3 is a flowchart illustrating a plasma processing method according to the exemplary embodiment.
Figure 4:
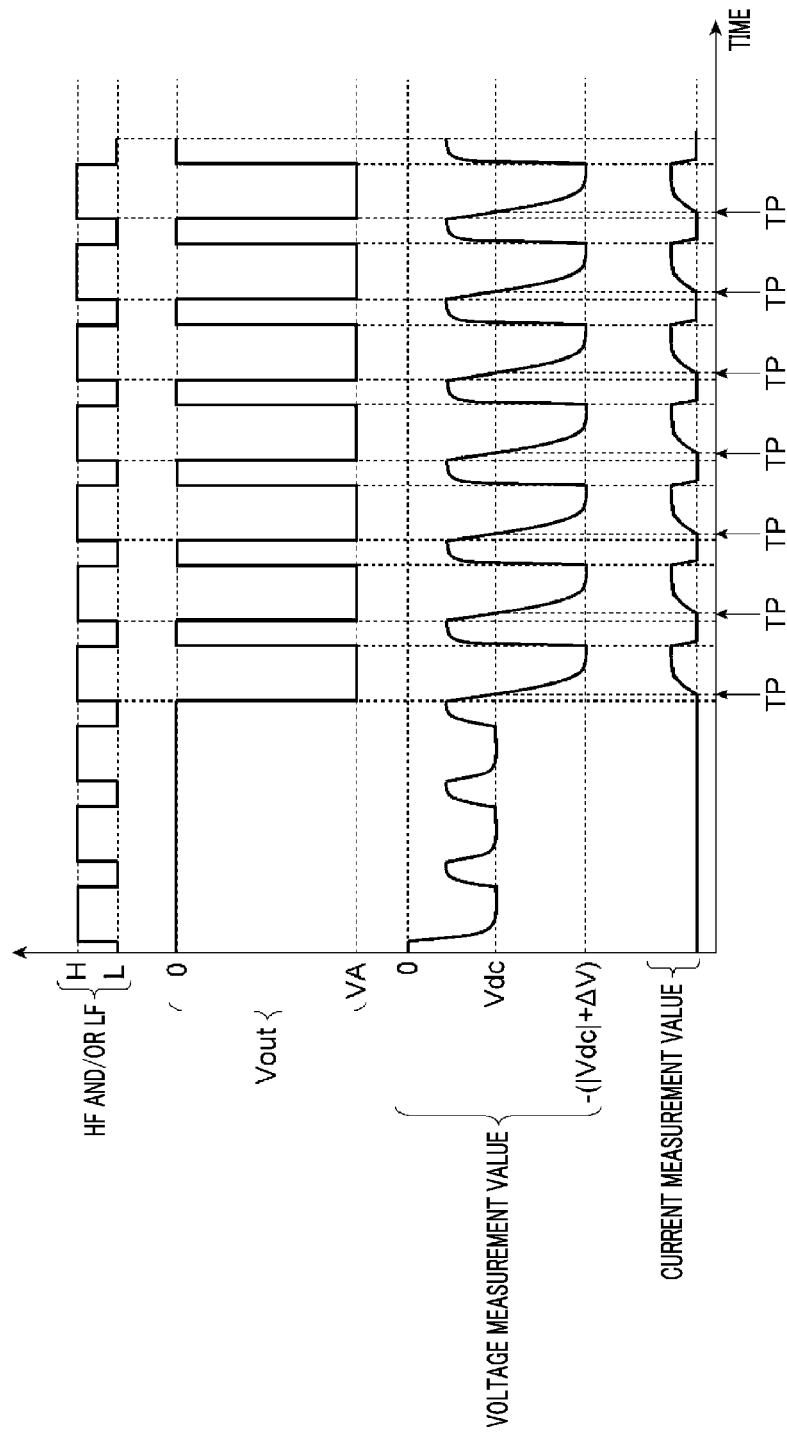
FIG. 4 is a timing chart related to the plasma processing method according to the exemplary embodiment.

Now, referring to FIG. 3 and FIG. 4, a plasma processing method according to one exemplary embodiment will be described. FIG. 3 is a flowchart illustrating the plasma processing method according to the exemplary embodiment. FIG. 4 is a timing chart related to the plasma processing method according to the exemplary embodiment. In the following description, the control by the controllers MC and PC of the plasma processing apparatus 1 will also be explained.

The plasma processing method (hereinafter, simply referred to as "method MT") shown in FIG. 3 starts from a process STa. In the process STa, the substrate W is prepared on the substrate support 16 within the chamber 10 of the plasma processing apparatus 1. The substrate W is placed within the region on the substrate support 16 surrounded by the edge ring ER, and held by the electrostatic chuck 20.

Then, the processing gas is supplied into the chamber 10, and the gas pressure within the chamber 10 is set to a designated pressure. For the purpose, the controller MC controls the gas supply to supply the processing gas into the chamber 10. Further, the controller MC also controls the gas exhaust device 50 to set the gas pressure within the chamber 10 to the designated pressure.

In a process STb, either or both of the radio frequency power HF and the radio frequency power LF are supplied. The process STb is performed in a period during which the supply of the processing gas into the chamber 10 is being performed. In the exemplary embodiment, at least one radio frequency power of the radio frequency power HF or the radio frequency power LF supplied in the process STb is supplied periodically as a radio frequency power in a pulse shape (that is, a pulse of the radio frequency power), as shown in FIG. 4. In the process STb, plasma is formed from the processing gas within the chamber 10. For the process STb, the controller MC controls the radio frequency power supply 61 and/or the radio frequency power supply 62 to supply the radio frequency power HF (a continuous wave or a pulse) and/or the radio frequency power LF (a continuous wave or a pulse).

The method MT may further include a process ST1. The process ST1 is performed to specify an initial value Vdci of a self-bias voltage Vdc of the edge ring ER. During the process ST1, an output voltage (denoted by Vout of FIG. 4) of the DC power supply 70 is set to be 0 V. In the process ST1, the controller PC uses, as the initial value Vdci of the self-bias voltage Vdc, the voltage measurement value of the edge ring ER obtained by the voltmeter 71 in a period during which either or both of the radio frequency power HF and the radio frequency power LF are being supplied. Further, the initial value Vdci of the self-bias voltage Vdc may be determined from a processing condition for a plasma processing performed in the method MT.

In a subsequent process ST2, a negative DC voltage VA to be applied from the DC power supply 70 to the edge ring ER in a process STc is set. In the process ST2, the negative DC voltage VA is set to have, as an absolute value thereof, the sum of an absolute value of the initial value Vdci of the self-bias voltage and a set value $\Delta V$. That is, the negative DC voltage VA to be applied to the edge ring ER from the DC power supply 70 in the process STc is set to be $-(|Vdci|+\Delta V)$.

In the process ST2, the set value $\Delta V$ is specified by the controller MC and set for the DC power supply 70 by the controller MC. By using a previously set function or table, the controller MC specifies the set value $\Delta V$ from a self-bias voltage of the lower electrode 18 specified from a consumption amount of the edge ring ER (a decrement of the thickness of the edge ring ER from an initial value thereof) and a processing condition for the plasma processing. That is, the controller MC determines the set value $\Delta V$ by inputting the consumption amount of the edge ring ER and the self-bias voltage of the lower electrode 18 into the aforementioned function, or by referring to the table with the consumption amount of the edge ring ER and the self-bias voltage of the lower electrode 18.

In determining the set value $\Delta V$, the controller MC may use a difference between the initial thickness of the edge ring ER and the measured thickness of the edge ring ER as the consumption amount of the edge ring ER. The thickness of the edge ring ER may be measured by using an optical measurement device such as a laser measurement device or an electrical measurement device. Alternatively, the controller MC may decide the consumption amount of the edge ring ER from the time and the processing condition for the plasma processing performed by using the edge ring ER.

The subsequent process STc is performed in a period during which the process STb is being performed. In the process STc, the negative DC voltage VA is applied to the edge ring ER from the DC power supply 70. The negative DC voltage applied in the process STc is initially the value set in the process ST2. In the process STc, the pulse of the negative DC voltage VA may be periodically applied to the edge ring ER, as shown in FIG. 4. The pulse of the negative DC voltage is synchronized with the pulse of the radio frequency power (the radio frequency power HF and/the radio frequency power LF) supplied in the process STb. For the process STc, the controller PC controls the DC power supply 70 to apply the negative DC voltage (or the pulse thereof) to the edge ring ER.

A subsequent process STd is performed in a period during which the process STc is being performed. In the process STd, the negative DC voltage VA to be applied to the edge ring ER from the DC power supply 70 is adjusted. The process STd includes a process STd1, a process STd2, and a process STd3.

In the process STd1, a time point TP (see FIG. 4), when the current starts to flow between the edge ring ER and the DC power supply 70 after the beginning of the application of the negative DC voltage (or the pulse thereof) to the edge ring ER from the DC power supply 70, is obtained. The time point TP when the current begins to flow is calculated by the controller PC from the current measurement value obtained by the ammeter 72. In the exemplary embodiment, a time point when the current measurement value obtained by the ammeter 72 exceeds a predetermined threshold within a preset time after the beginning of the application of the negative DC voltage VA to the edge ring ER from the DC power supply 70 is specified as the time point TP.

In the process STd2, an estimate Vdce of the self-bias voltage Vdc of the edge ring ER generated by the supply of the radio frequency power HF and/or LF is specified from the voltage measurement value obtained by the voltmeter 71 at the time point TP. The estimate Vdce is specified by the controller PC. In the exemplary embodiment, an average value (moving average value) of multiple voltage measurement values may be used as the estimate Vdce of the self-bias voltage Vdc. The multiple voltage measurement values may be obtained by repeating the acquisition of the voltage measurement value at the time point TP through the periodic application of the pulse of the negative DC voltage from the DC power supply 70 to the edge ring ER.

In the process STd3, the absolute value of the negative DC voltage VA applied to the edge ring ER by the DC power supply 70 is set to be the sum of an absolute value of the estimate Vdce of the self-bias voltage Vdc and the set value $\Delta V$. That is, the negative DC voltage VA applied to the edge ring ER from the DC power supply 70 in the process STc is set to be $-(|Vdce|+\Delta V)$. The setting of the negative DC voltage VA in the process STd3 is performed by the controller PC.

The method MT may further include a process STJ. In the process STJ, it is determined whether a stop condition is satisfied. For example, the stop condition is satisfied if an elapsed time of the plasma processing reaches a preset time, or if it is determined as a result of the end point detection that the plasma processing is in a state to be terminated. If it is determined in the process STJ that the stop condition is not satisfied, the process STc and the process STd are continued. Meanwhile, if it is determined in the process STJ that the stop condition is satisfied, the method MT is ended.

After the beginning of the application of the negative DC voltage to the edge ring ER, the current starts to flow between the edge ring ER and the DC power supply 70 at the time point when the voltage of the edge ring ER exceeds the self-bias voltage Vdc. Thus, it becomes possible to obtain the estimate Vdce of the self-bias voltage Vdc of the edge ring ER from the voltage measurement value obtained in the state that the negative DC voltage is applied to the edge ring ER, and adjust the negative DC voltage to be applied to the edge ring ER based on the estimate Vdce. Further, since the estimate Vdce of the self-bias voltage Vdc of the edge ring ER can be obtained from the voltage measurement value in the state that the application of the negative DC voltage is not stopped, it is possible to suppress fluctuation of the plasma in the acquisition of the corresponding voltage measurement value, thus suppressing a reflection wave.

So far, the various exemplary embodiments have been described. However, the present disclosure is not limited to the above-described exemplary embodiments, and various additions, omissions, replacements and modifications may be made. Further, by combining the components in the various exemplary embodiments, other exemplary embodiments may be conceived.

By way of example, in another exemplary embodiment, the plasma processing apparatus may be a capacitively coupled plasma processing apparatus different from the plasma processing apparatus 1. Further, in yet another exemplary embodiment, the plasma processing apparatus may be a plasma processing apparatus of a type other than the capacitively coupled type. Such a plasma processing apparatus may be an inductively coupled plasma processing apparatus, an electron cyclotron resonance plasma processing apparatus, or a plasma processing apparatus configured to generate plasma by using a surface wave such as a microwave.

Moreover, the above-described control by the controller PC may be carried out by the controller MC. In such a case, the plasma processing apparatus 1 may not be equipped with the controller PC.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

According to the exemplary embodiment, the negative DC voltage to be applied to the edge ring can be adjusted based on the estimate of the self-bias voltage of the edge ring obtained in the state that the corresponding negative DC voltage is applied to the edge ring.

We claim:
1. A plasma processing apparatus, comprising:
a chamber;
a substrate support, provided within the chamber, including an electrode and an electrostatic chuck provided on the electrode;
a radio frequency power supply configured to supply a radio frequency power to the electrode;
a DC power supply electrically coupled to an edge ring disposed on the substrate support to surround a substrate, and configured to generate a negative DC voltage to be applied to the edge ring;
a voltmeter configured to acquire a voltage measurement value indicating a voltage of the edge ring;

an ammeter configured to acquire a current measurement value indicating a current flowing between the edge ring and the DC power supply; and a controller configured to control the DC power supply, wherein the controller specifies, from the current measurement value acquired by the ammeter, a time point when the current starts to flow between the edge ring and the DC power supply after beginning an application of the negative DC voltage to the edge ring from the DC power supply, the controller specifies, from the voltage measurement value acquired by the voltmeter at the time point, an estimate of a self-bias voltage of the edge ring generated by a supply of the radio frequency power, and the controller sets a sum of an absolute value of the estimate of the self-bias voltage and a predetermined value as an absolute value of the negative DC voltage to be applied to the edge ring by the DC power supply, wherein the radio frequency power supply is further configured to supply a pulse of the radio frequency power periodically, and the DC power supply is further configured to apply a pulse of the negative DC voltage to the edge ring periodically in synchronization with the pulse of the radio frequency power, wherein the voltage measurement value is acquired while the negative DC voltage is being applied to the edge ring.

2. The plasma processing apparatus of claim 1, wherein the controller is configured to use, as the estimate of the self-bias voltage, an average value of multiple voltage measurement values obtained by repeating the acquisition of the voltage measurement value at the time point while periodically applying the pulse of the negative DC voltage to the edge ring.

3. The plasma processing apparatus of claim 1, wherein the ammeter and the voltmeter are embedded in the DC power supply.

4. The plasma processing apparatus of claim 1, wherein the ammeter and the voltmeter are provided at an outside of the DC power supply.

5. The plasma processing apparatus of claim 1, wherein the controller is embedded in the DC power supply.

6. The plasma processing apparatus of claim 1, wherein the controller is provided at an outside of the DC power supply.

7. The plasma processing apparatus of claim 1, wherein the controller specifies, as the time point when the current starts to flow between the edge ring and the DC power supply, a time point when the current measurement value exceeds a preset threshold within a preset time after beginning the application of the negative DC voltage to the edge ring from the DC power supply.

* * * * *